United States Patent
Lee

[11] Patent Number: 5,933,755
[45] Date of Patent: Aug. 3, 1999

[54] METHOD OF FABRICATING CONTACT SITES FOR MICROELECTRONIC DEVICES

[75] Inventor: Joo-young Lee, Kyungki-do, Rep. of Korea

[73] Assignee: Samsung Electronics Co, Ltd., Rep. of Korea

[21] Appl. No.: 08/960,856

[22] Filed: Oct. 30, 1997

[30] Foreign Application Priority Data

Oct. 31, 1996 [KR] Rep. of Korea ............... 96-51485

[51] Int. Cl.$^6$ ............................................. H01L 21/265
[52] U.S. Cl. .................. 438/634; 438/634; 438/761; 438/762; 438/696; 438/702; 438/701; 438/639; 438/640; 438/629; 438/637; 438/638
[58] Field of Search .................... 438/761, 762, 438/634, 637, 638, 639, 640, 696, 702, 701, 620, 624, 629

[56] References Cited

U.S. PATENT DOCUMENTS

| | | | |
|---|---|---|---|
| 5,084,416 | 1/1992 | Ozaki et al. | 438/638 |
| 5,275,972 | 1/1994 | Ogawa et al. | 438/639 |
| 5,420,077 | 5/1995 | Saito et al. | 438/640 |
| 5,484,744 | 1/1996 | Hong | 438/396 |
| 5,565,372 | 10/1996 | Kim | 438/639 |

*Primary Examiner*—Charles Bowers
*Assistant Examiner*—Thanh Nguyen
*Attorney, Agent, or Firm*—Myers Bigel Sibley & Sajovec

[57] ABSTRACT

A contact site is formed for contacting a substrate adjacent an electrode formed on the substrate, the electrode and the substrate being separated by a first insulating layer formed on the substrate, the electrode having a top surface and a sidewall surface. A second insulating layer is formed which covers the top and sidewall surfaces of the electrode. A dielectric region is then formed on the second insulating layer, overlying the electrode and disposed adjacent an exposed portion of the second insulating layer which overlies a portion of the microelectronic layer laterally adjacent the electrode, the dielectric region having a sidewall surface adjacent the exposed portion of the second insulating layer. A third insulating layer is formed which covers the exposed portion of the second insulating layer and the sidewall surface of the dielectric region. Portions of the first, second and third insulating layers are then removed to expose a portion of the substrate adjacent the electrode while leaving the electrode covered. The dielectric region may be formed by forming an etching stop layer on the second insulating layer, forming a dielectric layer on the etching stop layer, and removing portions of the dielectric layer and the etching stop layer to expose a portion of the second insulating layer overlying a portion of the microelectronic layer laterally adjacent the electrode and to form a dielectric region and an etching stop region adjacent the exposed portion of the second insulating layer, the dielectric region and the etching stop regions having respective sidewall surfaces adjacent the exposed portion of the second insulating layer. The third insulating layer may be formed to cover the exposed portion of the second insulating layer and the sidewall surfaces of the dielectric and etching stop regions.

16 Claims, 3 Drawing Sheets

METHOD OF FABRICATING CONTACT SITES FOR MICROELECTRONIC DEVICES

FIELD OF THE INVENTION

The present invention relates to microelectronic devices and methods of fabrication therefor, more particularly, to microelectronic devices having contact sites formed thereon and methods of fabricating contact sites for microelectronic devices.

BACKGROUND OF THE INVENTION

As the area occupied by cell regions of semiconductor devices such as dynamic random access memories (DRAMs) has decreased with the increased integration density of the semiconductor devices, contact resistance has tended to increase because the area of a semiconductor substrate exposed by the contact hole typically is decreased. Because of the decreased contact hole size, a conductive layer for filling the contact hole may short to adjacent structures such as gate electrodes, for example, when misalignment occurs during photolithographic processes used in forming the contact hole.

FIGS. 1 to 3 are cross-sectional views illustrating a conventional method for forming a self-aligned contact hole. A gate insulating film 20, e.g., silicon dioxide, is formed on a semiconductor substrate 10. Then, a gate conductive layer, for example, a polycrystalline silicon layer doped with impurities, is formed on the entire surface of the substrate 10 on which the gate insulating film 20 is formed. A capping layer, for example a silicon nitride film or a silicon oxide film, is formed on the gate conductive layer. Capping layer patterns 40 and the gate electrodes 30 are then formed by patterning the capping layer and the gate conductive layer so as to expose the gate insulating film 20. Here, the gate electrode 30 and the capping layer pattern 40 construct a gate pattern 45, with the gate patterns 45 being separated from each other by a predetermined distance. Subsequently, an insulating film 50, for example, a silicon nitride film, is formed on the substrate, covering the gate patterns 45.

Referring to FIG. 2, an interlayer dielectric film whose surface is flat, for example, a borophosphosilicate glass (BPSG) film or an undoped silicate glass (USG) film, is formed on the spacer insulating film 50. A photosensitive layer pattern 65 is then formed having a hole for exposing the interlayer dielectric film positioned above the region between the gate patterns 45 and the edge of the capping layer pattern 40. An interlayer dielectric film pattern 60 is formed by anisotropically etching the interlayer dielectric film so as to expose the spacer insulating film 50 using the photosensitive layer pattern 65 as an etching mask.

Referring to FIG. 3, a spacer insulating film pattern 50b and a gate insulating film pattern 20a are formed by sequentially etching the modified spacer insulating film 50a and the gate insulating film 20 using the photosensitive layer 65 as an etching mask, forming a contact hole h for exposing a predetermined region of the semiconductor substrate 10 positioned between the gate patterns 45. In forming the interlayer dielectric film pattern 60, a portion of the spacer insulating film 50a adjacent the shoulder A of the gate pattern 45 may be etched an excessive amount due to a sputtering effect during the anisotropic etching of the interlayer dielectric film, even if the etching selection ratio of the interlayer dielectric film with respect to the spacer insulating film 50 is large (see J. Gambino et al., "A Si3N4 Etch Stop Process for Borderless Contacts in 0.25 µm Devices", IEEE V-MIC Proc. 1995, pp. 558–564). The capping layer 40 may be etched, as the thickness of the modified spacer insulating film 50a formed on the shoulder A of the gate pattern 45 is decreased. Accordingly, a modified capping layer 40a may be formed which exposes a predetermined region of the upper surface of the shoulder of the gate electrode 30, resulting in a modified gate pattern 45a. The upper side wall of the gate electrode 30, as well as a predetermined region of the upper surface of the shoulder of the gate electrode 30, may be exposed because the spacer insulating film pattern 50b does not completely cover the entire surface of the side wall. A spacer 50c on the side wall of the capping layer pattern 40 and the gate electrode 30 also may not be completely formed. As a consequence, a conductive layer formed in the contact hole h and contacting the semiconductor substrate 10 may be also connected to the gate electrode 30.

Unfortunately, there tend to be limitations to increasing the thickness of the capping layer pattern 40 in order to prevent a predetermined region of the upper surface of the shoulder of the gate electrode 30 from being exposed. The surface step coverage of the substrate on which the gate patterns are formed tends to increase when the capping layer pattern 40 is thickened, thus generating difficulties in flattening the interlayer dielectric film. Therefore, it is generally not desirable to make the capping layer pattern 40 thick.

SUMMARY OF THE INVENTION

In light of the foregoing, it is an object of the present invention to provide microelectronic devices and methods of fabricating contact sites therefor which have a reduced likelihood of exposing a nearby electrode and thereby allowing a short to be formed between the electrode and a conductive layer contacting the contact site.

This and other objects, features and advantages are provided according to the present invention by microelectronic devices and methods of forming contact sites therefor in which an electrode is covered by an insulating layer, an etching stop layer and a dielectric layer. Portions of the dielectric layer and the etching stop layer overlying a portion of the substrate adjacent the electrode are first etched away to expose a portion of the capping layer adjacent the electrode. Another insulating layer is then formed on the exposed insulating layer and on sidewall surfaces of the dielectric layer and the etching stop layer. The insulating layers are then anisotropically etched to expose a portion of the substrate adjacent the electrode without exposing the electrode. By forming the additional insulating layer after etching the dielectric and etching stop layers, the likelihood of exposing the electrode during subsequent etching to expose the substrate may be reduced, thus reducing the likelihood of forming a short when a conductive region is formed at the contact site.

In particular, according to the present invention, a contact site is formed for contacting a substrate adjacent an electrode formed on the substrate, the electrode and the substrate being separated by a first insulating layer formed on the substrate, the electrode having a top surface and a sidewall surface. A second insulating layer is formed which covers the top and sidewall surfaces of the electrode. A dielectric region is then formed on the second insulating layer, overlying the electrode and disposed adjacent an exposed portion of the second insulating layer which overlies a portion of the microelectronic layer laterally adjacent the electrode, the dielectric region having a sidewall surface adjacent the exposed portion of the second insulating layer. A third insulating layer is formed which covers the exposed portion of the second insulating layer and the sidewall surface of the dielectric region. Portions of the first, second and third insulating layers are then removed to expose a portion of the substrate adjacent the electrode while leaving the electrode covered. The dielectric region may be formed by forming an etching stop layer on the second insulating layer, forming a dielectric layer on the etching stop layer, and removing portions of the dielectric layer and the etching stop layer to expose a portion of the second insulating layer overlying a portion of the microelectronic layer laterally adjacent the electrode. Concurrently, a dielectric region and an etching stop region may be formed adjacent the exposed portion of the second insulating layer, the dielectric region and the etching stop regions having respective sidewall surfaces adjacent the exposed portion of the second insulating layer. The third insulating layer may cover the exposed portion of the second insulating layer and the sidewall surfaces of the dielectric and etching stop regions.

The portions of the first and second insulating layers may be removed by anisotropically etching the first, second and third insulating layers to expose a portion of the substrate adjacent the electrode while leaving the electrode covered. An electrode insulating region underlying the electrode and an electrode capping insulation region covering the electrode and contacting the electrode insulating region adjacent the exposed portion of the substrate may thereby be formed. A sidewall spacer region disposed adjacent the sidewall surfaces of the dielectric and etching stop regions may also be formed.

According to one aspect of the present invention, the portions of the dielectric layer and the etching stop layer may be removed by forming a photoresist layer having a opening therein overlying a portion of the substrate laterally adjacent the electrode, anisotropically etching the dielectric layer using the photoresist layer as an etching mask to expose a portion of the etching stop layer overlying a portion of the substrate laterally adjacent the electrode, and etching the exposed portion of the etching stop layer using the photoresist layer as an etching mask to expose a portion of the first insulating layer overlying a portion of the substrate laterally adjacent the electrode. According to another aspect of the invention, the portions of the dielectric layer and the etching stop layer may be removed by forming a photoresist layer having a opening therein overlying a portion of the substrate laterally adjacent the electrode, anisotropically etching the dielectric layer using the photoresist layer as an etching mask to expose a portion of the etching stop layer overlying a portion of the substrate laterally adjacent the electrode and to form a dielectric region laterally adjacent the exposed portion of the etching stop layer, removing the photoresist layer, and then etching the exposed portion of the etching stop layer using the dielectric region as an etching mask to expose a portion of the second insulating layer overlying a portion of the substrate laterally adjacent the electrode.

According to other method aspects of the present invention, a site for contacting a substrate is formed between spaced apart first and second electrodes formed on the substrate, the first and second electrodes and the substrate being separated by a first insulating layer formed on the substrate, the first and second electrodes each having a top surface and a sidewall surface. A second insulating layer is formed which covers the top and sidewall surfaces of the electrodes. First and second dielectric regions are formed on the second insulating layer overlying the first and second electrodes respectively and disposed on opposite sides of an exposed portion of the second insulating layer which overlies a portion of the microelectronic layer disposed between the first and second electrodes, each of the first and second dielectric regions having a sidewall surface adjacent the exposed portion of the second insulating layer. A third insulating layer is formed which covers the exposed portion of the second insulating layer and the sidewall surfaces of the first and second dielectric regions. Portions of the first, second and third insulating layers are removed to expose a portion of the substrate between the first and second electrodes while leaving the first and second electrodes covered.

According to yet another aspect of the present invention, a microelectronic device includes a substrate, spaced apart first and second electrode insulating regions on the substrate disposed on opposite sides of an exposed portion of the substrate. Spaced apart first and second electrodes are disposed on the first and second electrode insulating regions, respectively, each of the first and second electrodes having a top surface and a sidewall surface disposed adjacent the exposed portion of the substrate. First and second electrode capping insulation regions cover the top and sidewall surfaces of the first and second electrodes, respectively, and contact respective ones of the first and second electrode insulating regions adjacent the exposed portion of the substrate. First and second dielectric regions overlie the first and second electrode capping insulation regions. First and second sidewall spacer regions are disposed on sidewall surfaces of the first and second dielectric regions, respectively, adjacent the exposed portion of the substrate.

BRIEF DESCRIPTION OF THE DRAWINGS

Some of the objects and advantages of the present invention having been stated, others will be more fully understood from the detailed description that follows and by reference to the accompanying drawings in which.

DETAILED DESCRIPTION OF PREFERRED EMBODIMENTS

Figure 1:
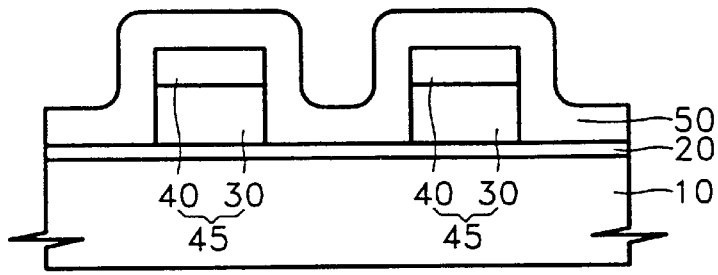
FIGS. 1–3 are cross-sectional views illustrating a conventional technique for fabricating a contact hole for a semiconductor device.
Figure 2:
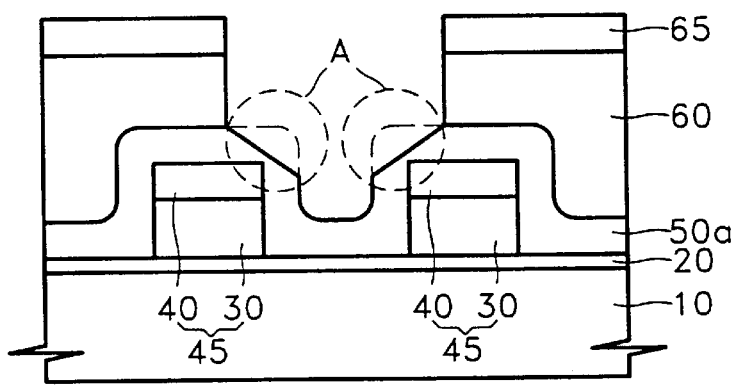
Figure 3:
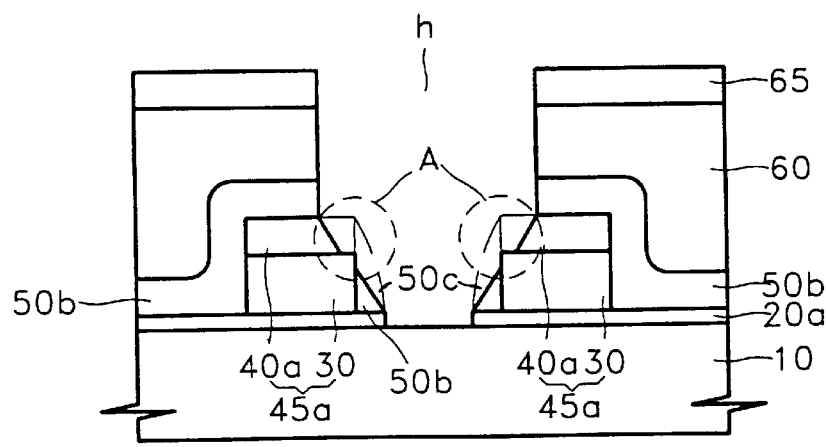

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout.

Figure 4:
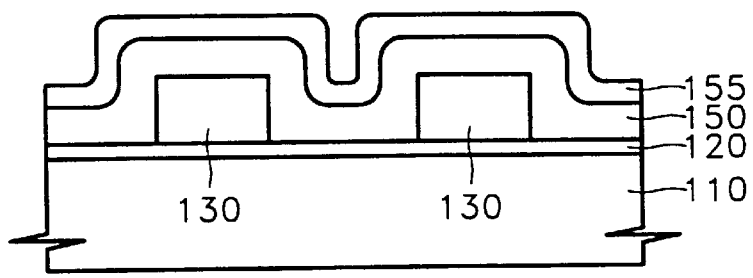
FIGS. 4–7 are cross-sectional views of intermediate fabrication products illustrating operations for forming a contact site for a microelectronic device according to the present invention.

Referring to FIG. 4, a first insulating layer 120, e.g., a silicon dioxide layer, is formed on a semiconductor substrate 110. A gate conductive layer, e.g., a polycrystalline silicon layer doped with impurities, is then formed on the first insulating layer 120. Spaced apart first and second electrodes 130 are formed by patterning the conductive layer. A second insulating layer 150, for example a silicon nitride layer, is formed, covering the gate electrodes 130. An etching stop layer 155, e.g., a polycrystalline silicon layer having a thickness of 700Å to 1000Å, is formed on the second insulating layer 150.

Figure 5:
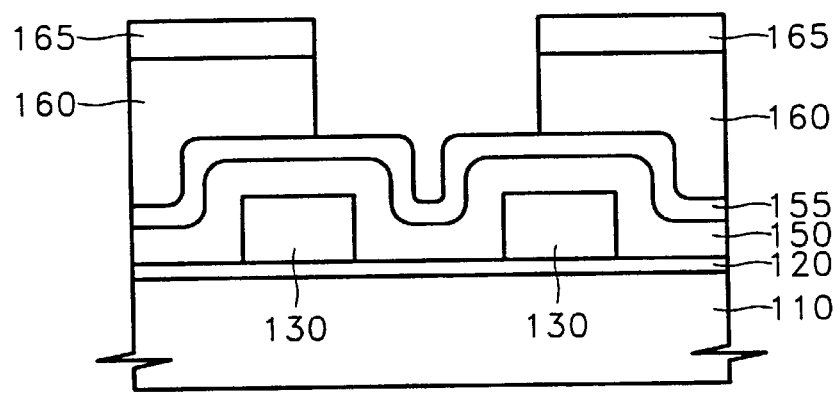

As illustrated in FIG. 5, a dielectric layer, preferably a planarized borophosphosilicate glass (BPSG) or undoped silicate glass (USG) layer, is formed on the etching stop layer 155. A photoresist layer 165 having an opening which exposes a portion of the dielectric layer between the gate electrodes 130 is then formed. A dielectric region 160 is formed by anisotropically etching the dielectric layer using the photoresist pattern 165 as an etching mask, exposing a portion of the etching stop layer 155.

Figure 6:
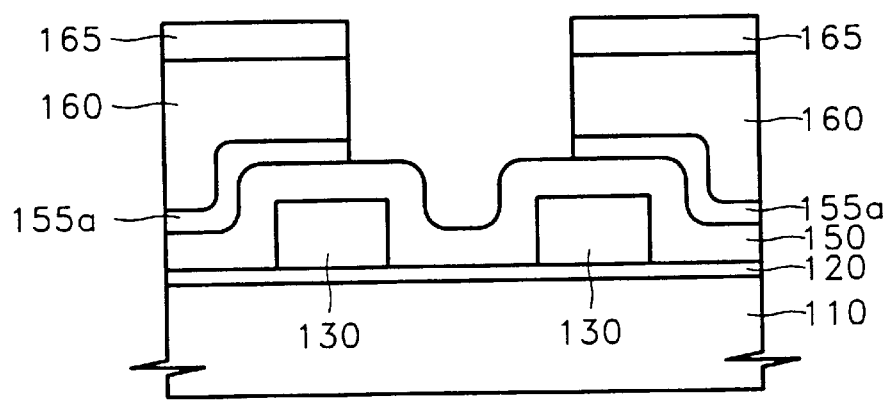

As illustrated in FIG. 6, an etching stop region 155a is formed by selectively etching the etching stop layer 155 so as to expose the second insulating layer 150, preferably using a dry etching method employing a gas including chlorine and using the photoresist layer 165 as an etching mask. Alternatively, the etching stop region 155a can be formed by using the dielectric region 160 as an etching mask, after removing the photoresist layer 165.

Figure 7:
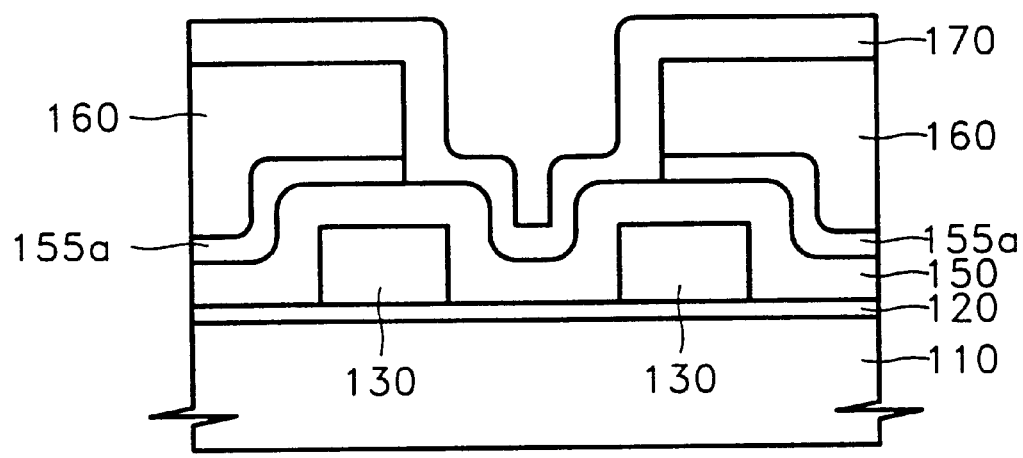
Figure 8:
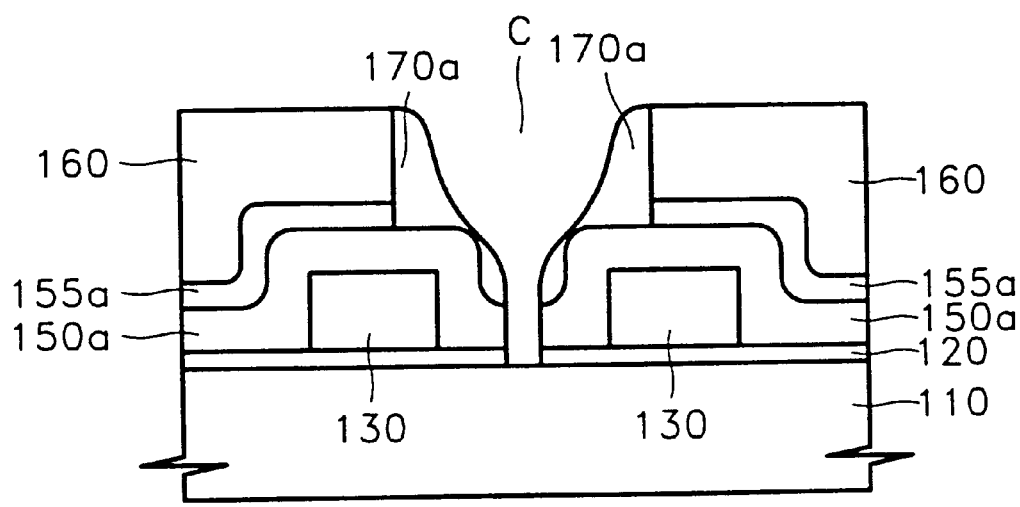
FIG. 8 is a cross-sectional view illustrating a microelectronic device according to the present invention and operations for fabrication thereof.

Referring to FIG. 7, a third insulating layer 170, for example a silicon nitride layer or a silicon dioxide layer, is formed on the substrate 110 after removing the photoresist layer 165. As shown in FIG. 8, a sidewall spacer region 170a, an electrode capping insulation region 150a, and an electrode insulation region 120a are formed by anisotropically etching the third insulating layer 170, the second insulating layer 150 and the first insulating layer 120 to expose a portion of the substrate 110 between the electrodes 130. In this manner, a contact hole C which exposes the semiconductor substrate 110 is formed. During etching, the surface of the dielectric region 160 may be exposed as a portion of the third insulating layer 170 on the dielectric region 160 is removed. The electrodes 130, however, can remain covered, as the shoulder of a gate electrode 130 can remain covered by the third insulating layer 170 even though the capping spacer insulating film 150 may be somewhat etched during forming the etching stop layer pattern. Therefore, it is possible to prevent shorting between the electrode 130 and a conductive material which is subsequently used to fill the contact hole C.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. A method of forming a site for contacting a substrate adjacent an electrode formed on the substrate, the electrode and the substrate being separated by a first insulating layer formed on the substrate, the electrode having a top surface and a sidewall surface, the method comprising the steps of:

forming a second insulating layer which covers the top and sidewall surfaces of the electrode;

forming an etching stop layer on the second insulating layer;

forming a dielectric layer on the etching stop layer;

etching through the dielectric layer using the etching stop layer as an etching stop to expose a portion of the etching stop layer adjacent the electrode and to form a dielectric region overlying the electrode and having a sidewall surface adjacent the exposed portion of the etching stop layer;

etching through the exposed portion of the etching stop layer to expose a portion of the second insulating layer adjacent the electrode and to form an etching stop region overlying the electrode and having a sidewall surface adjacent the exposed portion of the second insulating layer;

forming a third insulating layer which covers the exposed portion of the second insulating layer and the sidewall surfaces of the dielectric and etching stop regions; and removing portions of the first, second and third insulating layers to expose a portion of the substrate adjacent the electrode while leaving the electrode covered.

2. A method according to claim 1:

wherein said step of forming a second insulating layer comprises the step of forming a silicon nitride layer;

wherein said step of forming an etching stop layer comprises the step of forming a polycrystalline silicon layer;

wherein said step of forming a dielectric layer comprises the step of forming one of a borophosphosilicate glass (BPSG) layer or an undoped silicate glass (USG) layer; and wherein said step of forming a third insulating layer comprises the step of forming one of a silicon nitride layer or a silicon dioxide layer.

3. A method according to claim 1, wherein said step of forming a dielectric layer comprises the steps of:

forming a dielectric layer comprising one of borophosphosilicate glass (BPSG) or undoped silicate glass (USG); and planarizing the dielectric layer.

4. A method according to claim 1:

wherein said step of etching through the dielectric layer is preceded by the step of forming a photoresist layer having an opening therein overlying a portion of the substrate laterally adjacent the electrode;

wherein said step of etching through the dielectric layer comprises the step of anisotropically etching the dielectric layer using the photoresist layer as an etching mask to expose a portion of the etching stop layer overlying a portion of the substrate laterally adjacent the electrode; and wherein said step of etching through the exposed portion of the etching stop layer comprises the step of etching the exposed portion of the etching stop layer using the photoresist layer as an etching mask to expose a portion of the second insulating layer overlying a portion of the substrate laterally adjacent the electrode.

5. A method according to claim 1:

wherein said step of etching through the dielectric layer is preceded by the step of forming a photoresist layer having an opening therein overlying a portion of the substrate laterally adjacent the electrode;

wherein said step of etching through the dielectric layer comprises the step of anisotropically etching the dielectric layer using the photoresist layer as an etching mask to expose a portion of the etching stop layer overlying a portion of the substrate laterally adjacent the electrode and to form a dielectric region laterally adjacent the exposed portion of the etching stop layer;

wherein said step of etching through the exposed portion of the etching stop layer is preceded by the step of removing the photoresist layer; and wherein said step of etching through the exposed portion of the etching stop layer comprises the step of etching the exposed portion of the etching stop layer using the dielectric region as an etching mask to expose a portion of the second insulating layer overlying a portion of the substrate laterally adjacent the electrode.

6. A method according to claim 1, wherein said step of removing portions of the first, second and third insulating layers comprises the steps of anisotropically etching the first, second and third insulating layers to expose a portion of the substrate adjacent the electrode while leaving the electrode covered.

7. A method according to claim 6, wherein said step of anisotropically etching comprises the step of anisotropically etching the first, second and third insulating layers to expose a portion of the substrate adjacent the electrode, to form an electrode insulating region underlying the electrode, and to form an electrode capping insulation region covering the electrode and contacting the electrode insulating region adjacent the exposed portion of the substrate.

8. A method according to claim 7, wherein said step of anisotropically etching comprises the step of anisotropically etching the first, second and third insulating layers to form an sidewall spacer region disposed adjacent the sidewall surfaces of the dielectric and etching stop regions.

9. A method of forming a contact site for contacting a substrate between spaced apart first and second electrodes formed on the substrate, the first and second electrodes and the substrate being separated by a first insulating layer formed on the substrate, the first and second electrodes each having a top surface and a sidewall surface, the method comprising the steps of:

forming a second insulating layer which covers the top and sidewall surfaces of the electrodes;

forming an etching stop layer on the second insulating layer;

forming a dielectric layer on the etching stop layer;

etching through the dielectric layer using the etching stop layer as an etching stop to expose a portion of the etching stop layer between the electrodes and to form first and second dielectric regions on respective first and second sides of the exposed portion of the etching stop layer, the first and second dielectric regions having respective sidewall surfaces;

removing a portion of the exposed portion of the etching stop layer to expose a portion of the second insulating layer between the electrodes and to form respective first and second etching stop regions on the respective first and second sides of the exposed portion of the second insulating layer, the first and second etching stop regions having respective sidewall surfaces;

forming a third insulating layer which covers the exposed portion of the second insulating layer and the sidewall surfaces of the first and second dielectric region and the first and second etching stop regions; and removing portions of the first, second and third insulating layers to expose a portion of the substrate between the first and second electrodes while leaving the first and second electrodes covered.

10. A method according to claim 9:

wherein said step of forming a second insulating layer comprises the step of forming a silicon nitride layer;

wherein said step of forming an etching stop layer comprises the step of forming a polycrystalline silicon layer;

wherein said step of forming a dielectric layer comprises the step of forming one of a borophosphosilicate glass (BPSG) layer or an undoped silicate glass (USG) layer; and wherein said step of forming a third insulating layer comprises the step of forming one of a silicon nitride layer or a silicon dioxide layer.

11. A method according to claim 9, wherein said step of forming a dielectric layer comprises the steps of:

forming a dielectric layer comprising one of borophosphosilicate glass (BPSG) layer or undoped silicate glass (USG); and planarizing the dielectric layer.

12. A method according to claim 9:

wherein said step of etching through the dielectric layer is preceded by the step of forming a photoresist layer having an opening therein overlying a portion of the substrate disposed between the first and second electrodes;

wherein said step of etching through the dielectric layer comprises the step of anisotropically etching the dielectric layer using the photoresist layer as an etching mask to expose a portion of the etching stop layer overlying a portion of the substrate disposed between the first and second electrodes; and wherein said step of removing a portion of the exposed portion of the etching stop layer comprises the step of etching the exposed portion of the etching stop layer using the photoresist layer as an etching mask to expose a portion of the second insulating layer overlying a portion of the substrate disposed between the first and second electrodes.

13. A method according to claim 9:

wherein said step of etching through the dielectric layer is preceded by the step of forming a photoresist layer having an opening therein overlying a portion of the substrate disposed between the first and second electrodes;

wherein said step of etching through the dielectric layer comprises the step of anisotropically etching the dielectric layer using the photoresist layer as an etching mask to expose a portion of the etching stop layer overlying a portion of the substrate disposed between the first and second electrodes and to form first and second dielectric regions laterally adjacent the exposed portion of the etching stop layer;

wherein said step of removing a portion of the exposed portion of the etching stop layer is preceded by the step of removing the photoresist layer; and wherein said step of removing a portion of the exposed portion of the etching stop layer comprises the step of etching the exposed portion of the etching stop layer using the first and second dielectric regions as an etching mask to expose a portion of the second insulating layer overlying a portion of the substrate disposed between the first and second electrodes.

14. A method according to claim 9, wherein said step of removing portions of the first and second insulating layers comprises the step of anisotropically etching the first, second and third insulating layers to expose a portion of the substrate between the first and second electrodes while leaving the first and second electrodes covered.

15. A method according to claim 14, wherein said step of anisotropically etching comprises the step of anisotropically etching the first, second and third insulating layers to expose a portion of the substrate between the first and second electrodes, to form an first and second electrode insulating regions underlying the first and second electrodes, respectively, and to form first and second electrode capping insulation regions covering respective ones of the first and second electrodes and contacting the respective first and second electrode insulating regions adjacent the exposed portion of the substrate.

16. A method according to claim 15, wherein said step of anisotropically etching comprises the step of anisotropically etching the first, second and third insulating layers to form first and second sidewall spacer regions disposed adjacent the sidewall surfaces of the first and second dielectric regions and the first and second etching stop regions.

* * * * *